United States Patent
Khlat et al.

(10) Patent No.: US 12,489,420 B2
(45) Date of Patent: Dec. 2, 2025

(54) TUNABLE FERROELECTRIC ACOUSTIC RESONATOR STRUCTURE

(71) Applicant: Qorvo US, Inc., Greensboro, NC (US)

(72) Inventors: Nadim Khlat, Cugnaux (FR); Milad Zolfagharloo Koohi, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 225 days.

(21) Appl. No.: 18/242,066

(22) Filed: Sep. 5, 2023

(65) Prior Publication Data

US 2024/0097650 A1    Mar. 21, 2024

Related U.S. Application Data

(60) Provisional application No. 63/476,525, filed on Dec. 21, 2022, provisional application No. 63/406,791, filed on Sep. 15, 2022.

(51) Int. Cl.
    *H03H 9/24* (2006.01)
(52) U.S. Cl.
    CPC .................................. *H03H 9/24* (2013.01)
(58) Field of Classification Search
    CPC . H03H 9/24; H03H 9/205; H03H 2009/02195
    (Continued)

(56) References Cited

U.S. PATENT DOCUMENTS 4,924,195 A    5/1990  Gonda
6,242,843 B1   6/2001  Pohjonen et al.
(Continued)

FOREIGN PATENT DOCUMENTS

CN    107727125 A    2/2018
JP    3854212 B2    12/2006
(Continued)

OTHER PUBLICATIONS

Khan, A.I. et al., "Negative Capacitance in a Ferroelectric Capacitor," Nature Materials, vol. 14, Feb. 2015, first published Dec. 2014, Macmillan Publishers Limited, pp. 182-186.
(Continued)

*Primary Examiner* — Andrea Lindgren Baltzell
(74) *Attorney, Agent, or Firm* — Withrow & Terranova, P.L.L.C.

(57) ABSTRACT

A ferroelectric acoustic resonator structure is provided. The tunable ferroelectric acoustic resonator structure includes a pair of ferroelectric acoustic resonator networks coupled in parallel between a signal input and a signal output. The ferroelectric acoustic resonator networks are tuned by a pair of pulse voltages to resonate in a desired series resonance frequency. However, the pair of pulse voltages can change an equivalent capacitance to therefore cause a parallel resonance frequency of the tunable ferroelectric acoustic resonator structure to shift. Herein, the pair of pulse voltages are determined to cause one of the ferroelectric acoustic resonator networks to increase the equivalent capacitance and to cause another one of the ferroelectric acoustic resonator networks to decrease the equivalent capacitance by an equal amount. As a result, it is possible to keep the overall equivalent capacitance, and therefore the parallel resonance frequency, of the tunable ferroelectric acoustic resonator structure unchanged.

19 Claims, 5 Drawing Sheets

(58) Field of Classification Search
USPC .................................................. 333/186–188
See application file for complete search history.

(56) References Cited

U.S. PATENT DOCUMENTS

| | | | |
|---|---|---|---|
| 6,862,441 B2 | 3/2005 | Ella | |
| 7,161,434 B2 | 1/2007 | Rhodes | |
| 7,367,095 B2* | 5/2008 | Larson, III | H03H 9/605 29/25.35 |
| 7,454,178 B2 | 11/2008 | Block et al. | |
| 7,656,228 B2 | 2/2010 | Fukuda et al. | |
| 7,659,796 B2 | 2/2010 | Funami et al. | |
| 7,692,270 B2 | 4/2010 | Subramanyam et al. | |
| 7,804,374 B1 | 9/2010 | Brown et al. | |
| 8,269,577 B2 | 9/2012 | Inoue et al. | |
| 8,576,024 B2 | 11/2013 | Erb et al. | |
| 9,041,484 B2 | 5/2015 | Burgener et al. | |
| 9,190,979 B2 | 11/2015 | Granger-Jones et al. | |
| 9,255,912 B2 | 2/2016 | Johnston et al. | |
| 9,281,800 B2 | 3/2016 | Tsuzuki | |
| 9,438,202 B2 | 9/2016 | Reinhardt et al. | |
| 9,705,473 B2 | 7/2017 | David et al. | |
| 9,819,327 B2 | 11/2017 | Maruthamuthu et al. | |
| 9,847,769 B2 | 12/2017 | Khlat et al. | |
| 10,009,010 B2 | 6/2018 | Kando et al. | |
| 10,243,537 B2 | 3/2019 | Khlat | |
| 10,476,481 B2 | 11/2019 | Chen et al. | |
| 10,985,731 B2 | 4/2021 | Khlat | |
| 11,050,412 B2 | 6/2021 | Khlat et al. | |
| 11,095,268 B2 | 8/2021 | Schmidhammer | |
| 11,165,412 B2 | 11/2021 | Khlat et al. | |
| 11,165,413 B2 | 11/2021 | Khlat et al. | |
| 11,742,818 B2 | 8/2023 | Khlat | |
| 2002/0158717 A1 | 10/2002 | Toncich | |
| 2002/0163400 A1 | 11/2002 | Toncich | |
| 2006/0098723 A1 | 5/2006 | Toncich et al. | |
| 2007/0107519 A1 | 5/2007 | Liu et al. | |
| 2007/0131032 A1 | 6/2007 | Liu | |
| 2007/0296513 A1 | 12/2007 | Ruile et al. | |
| 2008/0065290 A1 | 3/2008 | Breed et al. | |
| 2009/0315643 A1 | 12/2009 | Yamakawa et al. | |
| 2010/0308933 A1 | 12/2010 | See et al. | |
| 2012/0212304 A1 | 8/2012 | Zhang et al. | |
| 2012/0313731 A1 | 12/2012 | Burgener et al. | |
| 2014/0070905 A1 | 3/2014 | Raieszadeh et al. | |
| 2015/0163044 A1 | 6/2015 | Analui et al. | |
| 2016/0191012 A1 | 6/2016 | Khlat et al. | |
| 2017/0040948 A1 | 2/2017 | Levesque | |
| 2017/0048859 A1 | 2/2017 | Hayakawa | |
| 2017/0093370 A1 | 3/2017 | Khlat et al. | |
| 2017/0214389 A1 | 7/2017 | Tsutsumi | |
| 2017/0230066 A1 | 8/2017 | Little et al. | |
| 2017/0244382 A1 | 8/2017 | Lear | |
| 2017/0264268 A1 | 9/2017 | Schmidhammer | |
| 2018/0076793 A1 | 3/2018 | Khlat et al. | |
| 2018/0123562 A1 | 5/2018 | Bradley | |
| 2018/0159562 A1 | 6/2018 | Bauder | |
| 2018/0234078 A1 | 8/2018 | Wada et al. | |
| 2019/0081613 A1 | 3/2019 | Nosaka | |
| 2019/0260355 A1 | 8/2019 | Khlat | |
| 2019/0393860 A1 | 12/2019 | Shih et al. | |
| 2020/0028491 A1 | 1/2020 | Kuroyanagi | |
| 2020/0076366 A1 | 3/2020 | Bahr et al. | |
| 2020/0099360 A1 | 3/2020 | Khlat | |
| 2020/0099362 A1* | 3/2020 | Khlat | H03H 9/02007 |
| 2020/0099363 A1 | 3/2020 | Khlat | |
| 2020/0099364 A1 | 3/2020 | Khlat | |
| 2020/0274519 A1 | 8/2020 | Gamble et al. | |
| 2021/0194459 A1 | 6/2021 | Alavi et al. | |
| 2021/0399750 A1 | 12/2021 | Varela Campelo | |
| 2023/0093885 A1 | 3/2023 | Ella et al. | |
| 2023/0134889 A1 | 5/2023 | Costa | |
| 2023/0223920 A1 | 7/2023 | Koohi et al. | |
| 2023/0223922 A1 | 7/2023 | Koohi et al. | |
| 2023/0223926 A1 | 7/2023 | Koohi et al. | |
| 2023/0299746 A1 | 9/2023 | Levesque | |
| 2024/0014803 A1 | 1/2024 | Khlat | |
| 2024/0053193 A1 | 2/2024 | Khlat | |
| 2024/0097650 A1 | 3/2024 | Khlat et al. | |
| 2024/0213956 A1 | 6/2024 | Khlat et al. | |
| 2024/0258992 A1 | 8/2024 | Khlat | |
| 2024/0333257 A1 | 10/2024 | Khlat | |
| 2024/0333259 A1 | 10/2024 | Khlat | |
| 2024/0364309 A1 | 10/2024 | Khlat | |
| 2024/0413809 A1 | 12/2024 | Khlat | |

FOREIGN PATENT DOCUMENTS

| | | |
|---|---|---|
| JP | 2009130831 A | 6/2009 |
| JP | 2022548348 A | 11/2022 |

OTHER PUBLICATIONS

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

\* cited by examiner

TUNABLE FERROELECTRIC ACOUSTIC RESONATOR STRUCTURE

RELATED APPLICATIONS

This application claims the benefit of U.S. provisional patent application Ser. No. 63/406,791, filed on Sep. 15, 2022, and the benefit of U.S. provisional patent application Ser. No. 63/476,525, filed on Dec. 21, 2022, the disclosures of which are hereby incorporated herein by reference in their entireties.

FIELD OF THE DISCLOSURE

The technology of the disclosure relates generally to a tunable ferroelectric acoustic resonator structure.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications.

Ferroelectric acoustic resonators, such as ferroelectric bulk acoustic resonators (FBAR), offer ultra-small sizes and can operate at frequencies up to tens of gigahertz. As such, ferroelectric resonators are widely used as miniaturized filters in many high-frequency devices, such as fifth generation (5G) and 5G new radio (5G-NR) communication and/or navigation devices. The operating frequency (a.k.a. series/parallel resonance frequency) of a ferroelectric acoustic resonator is typically determined by an inner structure (e.g., thickness and elastic properties) of the ferroelectric acoustic resonator. As such, it is desirable to electrically control the ferroelectric acoustic resonator to operate at a desired operating frequency without changing the inner structure of the ferroelectric acoustic resonator.

SUMMARY

Aspects disclosed in the detailed description include a tunable ferroelectric acoustic resonator structure. The tunable ferroelectric acoustic resonator structure includes a pair of ferroelectric acoustic resonator networks coupled in parallel between a signal input and a signal output. Understandably, the ferroelectric acoustic resonator networks can be tuned by a pair of pulse voltages to resonate in a desired series resonance frequency. However, the pair of pulse voltages can change an equivalent capacitance to therefore cause a parallel resonance frequency of the tunable ferroelectric acoustic resonator structure to shift. In embodiments disclosed herein, the pair of pulse voltages are so determined to cause one of the ferroelectric acoustic resonator networks to increase the equivalent capacitance and to cause another one of the ferroelectric acoustic resonator networks to decrease the equivalent capacitance by an equal amount. As a result, it is possible to keep the overall equivalent capacitance, and therefore the parallel resonance frequency, of the tunable ferroelectric acoustic resonator structure unchanged while tuning the series resonance frequency of the tunable ferroelectric acoustic resonator structure.

In one aspect, a tunable ferroelectric acoustic resonator structure is provided. The tunable ferroelectric acoustic resonator structure includes a resonator network. The resonator network is configured to present an equivalent capacitance between a signal input and a signal output in a parallel resonance frequency. The resonator network includes a first ferroelectric acoustic resonator network. The first ferroelectric acoustic resonator network is configured to cause a first variation in the equivalent capacitance in response to receiving a first pulse voltage. The resonator network also includes a second ferroelectric acoustic resonator network. The second ferroelectric acoustic resonator network is configured to cause a second variation in the equivalent capacitance in response to receiving a second pulse voltage. The tunable ferroelectric acoustic resonator structure also includes a control circuit. The control circuit is configured to determine the first pulse voltage and the second pulse voltage such that the first variation cancels the second variation to thereby keep the equivalent capacitance unchanged. The control circuit is also configured to apply the determined first pulse voltage and the determined second pulse voltage to the first ferroelectric acoustic resonator network and the second ferroelectric acoustic resonator network, respectively.

In another aspect, a resonator network is provided. The resonator network is configured to resonate at a series resonance frequency to pass a signal from a signal input to a signal output and present an equivalent capacitance between the signal input and the signal output in a parallel resonance frequency. The resonator network includes a first ferroelectric acoustic resonator network. The first ferroelectric acoustic resonator network is configured to receive a first pulse voltage for tuning the first ferroelectric acoustic resonator network to the series resonance frequency. The first ferroelectric acoustic resonator network is also configured to cause a first variation in the equivalent capacitance in response to receiving the first pulse voltage. The resonator network also includes a second ferroelectric acoustic resonator network. The second ferroelectric acoustic resonator network is configured to receive a second pulse voltage for tuning the second ferroelectric acoustic resonator network to the series resonance frequency. The second ferroelectric acoustic resonator network is also configured to cause a second variation in the equivalent capacitance in response to receiving the second pulse voltage. The first pulse voltage and the second pulse voltage are determined to cause the first variation to cancel the second variation to thereby keep the equivalent capacitance unchanged.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a tunable ferroelectric acoustic resonator structure. The tunable ferroelectric acoustic resonator structure includes a pair of ferroelectric acoustic resonator networks coupled in parallel between a signal input and a signal output. Understandably, the ferroelectric acoustic resonator networks can be tuned by a pair of pulse voltages to resonate in a desired series resonance frequency. However, the pair of pulse voltages can change an equivalent capacitance to therefore cause a parallel resonance frequency of the tunable ferroelectric acoustic resonator structure to shift. In embodiments disclosed herein, the pair of pulse voltages are so determined to cause one of the ferroelectric acoustic resonator networks to increase the equivalent capacitance and to cause another one of the ferroelectric acoustic resonator networks to decrease the equivalent capacitance by an equal amount. As a result, it is possible to keep the overall equivalent capacitance, and therefore the parallel resonance frequency, of the tunable ferroelectric acoustic resonator structure unchanged while tuning the series resonance frequency of the tunable ferroelectric acoustic resonator structure.

Figure 1A:
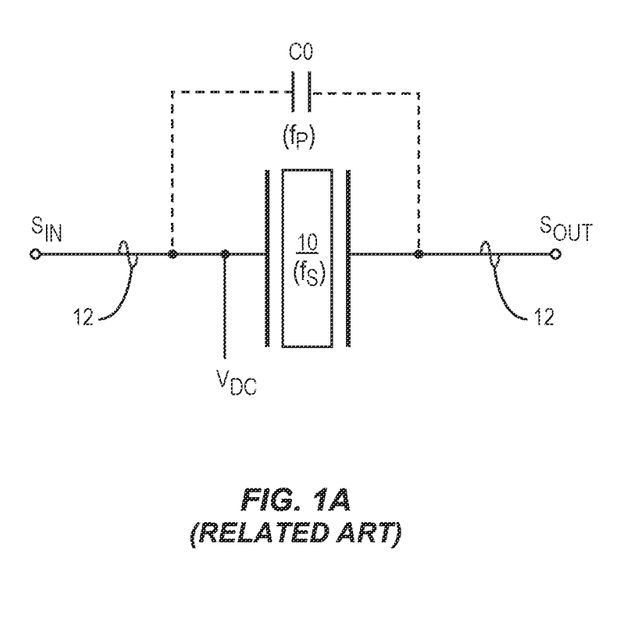
FIG. 1A is a schematic diagram of an exemplary existing tunable ferroelectric acoustic resonator.
Figure 1B:
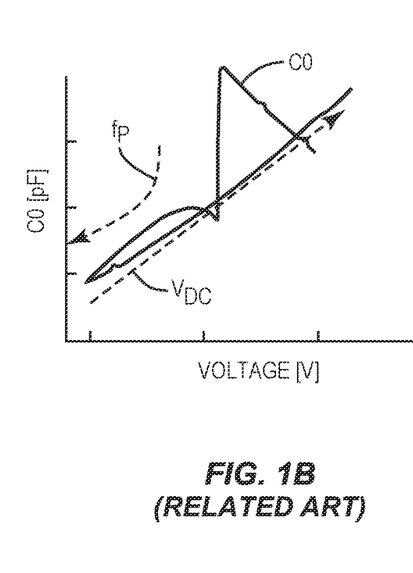
FIG. 1B is a graphic diagram providing an exemplary illustration as to how an equivalent capacitance of the existing tunable ferroelectric acoustic resonator in FIG. 1A may change when a series resonance frequency of the existing tunable ferroelectric acoustic resonator is tuned.
Figure 2:
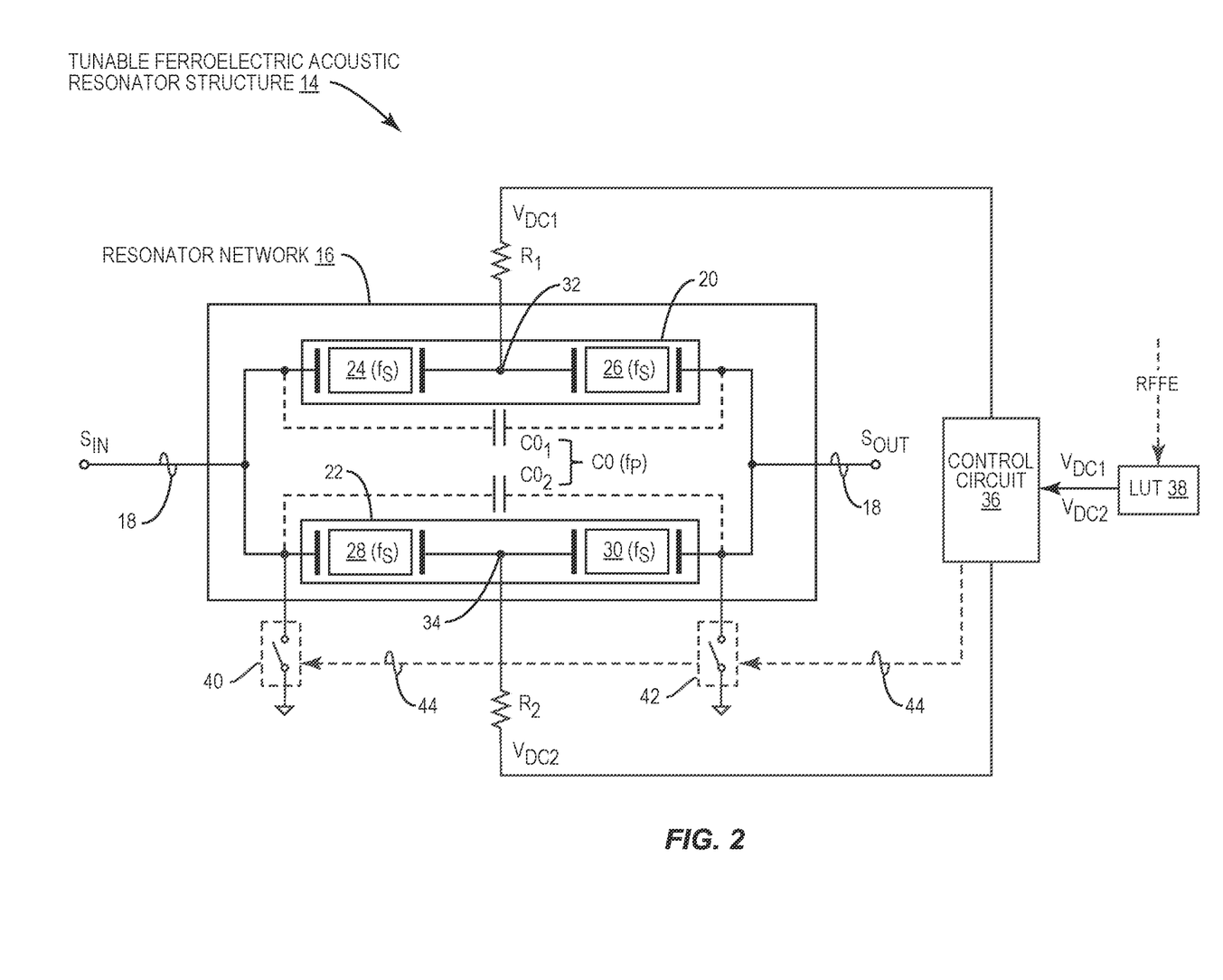
FIG. 2 is a schematic diagram of an exemplary tunable ferroelectric acoustic resonator structure configured according to an embodiment of the present disclosure to keep an equivalent capacitance of the tunable ferroelectric acoustic resonator structure unchanged while the tunable ferroelectric acoustic resonator structure is tuned to a series resonance frequency.

Before discussing a tunable ferroelectric acoustic resonator structure of the present disclosure, starting at FIG. 2, a brief discussion is first provided with reference to FIGS. 1A and 1B to help explain the technical problem to be solved by the tunable ferroelectric acoustic resonator structure of the present disclosure.

FIG. 1A is a schematic diagram of an exemplary existing tunable ferroelectric acoustic resonator 10. The existing tunable ferroelectric acoustic resonator 10 is designed to resonate in a series resonance frequency $f_S$ to pass a signal 12 from a signal input $S_{IN}$ to a signal output $S_{OUT}$. The existing tunable ferroelectric acoustic resonator 10 is also designed to present an equivalent parallel capacitance C0 between the signal input $S_{IN}$ and the signal output $S_{OUT}$ to thereby block the signal 12 in a parallel resonance frequency $f_P$ ($f_P \neq f_S$).

The series resonance frequency $f_S$ can be tuned by a pulse voltage $V_{DC}$ that polarizes the existing tunable ferroelectric acoustic resonator 10. In this regard, FIG. 1B is a graphic diagram providing an exemplary illustration as to how an equivalent capacitance C0 of the existing tunable ferroelectric acoustic resonator 10 in FIG. 1A may change when the series resonance frequency $f_S$ of the existing tunable ferroelectric acoustic resonator 10 is tuned.

As shown in FIG. 1B, the pulse voltage $V_{DC}$ can cause the equivalent capacitance C0 to increase. As a result, the parallel resonance frequency $f_P$ will decrease. The decrease in the parallel resonance frequency $f_P$ can create problems (e.g., insufficient separation between a passband and a stopband) in some applications. As such, it is desirable to keep the equivalent capacitance C0 unchanged while tuning the series resonance frequency $f_S$ of the existing tunable ferroelectric acoustic resonator 10.

In this regard, FIG. 2 is a schematic diagram of an exemplary tunable ferroelectric acoustic resonator structure 14 configured according to an embodiment of the present disclosure to keep an equivalent capacitance C0 of the tunable ferroelectric acoustic resonator structure 14 unchanged while the tunable ferroelectric acoustic resonator structure 14 is tuned to a series resonance frequency $f_S$. The tunable ferroelectric acoustic resonator structure 14 includes a resonator network 16. The resonator network 16 is coupled between a signal input $S_{IN}$ and a signal output $S_{OUT}$. Like the existing tunable ferroelectric acoustic resonator 10, the resonator network 16 is configured to resonate in a series resonance frequency $f_S$ to pass a signal 18 from the signal input $S_{IN}$ to the signal output $S_{OUT}$. The resonator network 16 is also configured to present the equivalent capacitance C0 in a parallel resonance frequency $f_P$ to block the signal 18 between the signal input $S_{IN}$ and the signal output $S_{OUT}$.

According to an embodiment of the present disclosure, the resonator network 16 includes a first ferroelectric acoustic resonator network 20 and a second ferroelectric acoustic resonator network 22 that are coupled in parallel between the signal input $S_{IN}$ and the signal output $S_{OUT}$. Specifically, the first ferroelectric acoustic resonator network 20 includes a pair of first ferroelectric acoustic resonators 24, 26 coupled in series between the signal input $S_{IN}$ and the signal output $S_{OUT}$, and the second ferroelectric acoustic resonator network 22 includes a pair of second ferroelectric acoustic resonators 28, 30 coupled in series between the signal input $S_{IN}$ and the signal output $S_{OUT}$. The first ferroelectric acoustic resonators 24, 26 can be tuned to resonate in the series resonance frequency $f_S$ to pass the signal 18 from the signal input $S_{IN}$ to the signal output $S_{OUT}$ by applying a first pulse voltage $V_{DC1}$ to a first intermediate node 32 located in between the first ferroelectric acoustic resonators 24, 26. Likewise, the second ferroelectric acoustic resonators 28, 30 can be tuned to resonate in the series resonance frequency $f_S$ to pass the signal 18 from the signal input $S_{IN}$ to the signal output $S_{OUT}$ by applying a second pulse voltage $V_{DC2}$ to a second intermediate node 34 located in between the second ferroelectric acoustic resonators 28, 30.

Herein, the first ferroelectric acoustic resonator network 20 is configured to present a first equivalent capacitance $C0_1$ between the signal input $S_{IN}$ and the signal output $S_{OUT}$, and the second ferroelectric acoustic resonator network 22 is configured to present a second equivalent capacitance $C0_2$ between the signal input $S_{IN}$ and the signal output $S_{OUT}$. Prior to applying the first pulse voltage $V_{DC1}$ and the second pulse voltage $V_{DC2}$ respectively to the first intermediate node 32 and the second intermediate node 34, the first equivalent capacitance $C0_1$ and the second equivalent capacitance $C0_2$ each contribute to a portion (e.g., ½) of the equivalent capacitance C0 ($C0=C0_1+C0_2$).

However, when the first pulse voltage $V_{DC1}$ and the second pulse voltage $V_{DC2}$ are applied to tune the series resonance frequency $f_S$ of the first ferroelectric acoustic resonator network 20 and the second ferroelectric acoustic resonator network 22, the first equivalent capacitance $C0_1$ will increase by a first variation $\Delta C_1$, and the second equivalent capacitance $C0_2$ will increase by a second variation $\Delta C_2$. As a result, the equivalent capacitance C0 will increase by a sum of $\Delta C_1+\Delta C_2$. In this regard, to keep the equivalent capacitance C0 unchanged during tuning of the series resonance frequency $f_S$, it is necessary to make sure that the first variation $\Delta C_1$ and the second variation $\Delta C_2$ can cancel out each other.

In this regard, the tunable ferroelectric acoustic resonator structure 14 can be configured to include a control circuit 36, which can be a field-programmable gate array (FPGA) or an application-specific integrated circuit (ASIC), as an example. Herein, the control circuit 36 is configured to determine the first pulse voltage $V_{DC1}$ and the second pulse voltage $V_{DC2}$ such that the first variation $\Delta C_1$ and the second variation $\Delta C_2$ can cancel each other. In other words, the first variation $\Delta C_1$ and the second variation $\Delta C_2$ need to be so generated with an equal amount of each other but with different polarities ($\Delta C_1=-\Delta C_2$). In this regard, when the first equivalent capacitance $C0_1$ is increased by $\Delta C_1$, the second equivalent capacitance $C0_2$ is decreased by $\Delta C_2$. Alternatively, when the first equivalent capacitance $C0_1$ is decreased by $\Delta C_1$, the second equivalent capacitance $C0_2$ is increased by $\Delta C_2$. As a result, a sum of the first equivalent capacitance $C0_1$ and the second equivalent capacitance $C0_2$, which equals the equivalent capacitance C0, will remain unchanged.

In an embodiment, the relative change of the first equivalent capacitance $C0_1$ and the second equivalent capacitance $C0_2$ can be achieved by applying an appropriate combination of the first pulse voltage $V_{DC1}$ and the second pulse voltage $V_{DC2}$ to the first intermediate node 32 and the second intermediate node 34.

In one embodiment, the first ferroelectric acoustic resonators 24, 26 and the second ferroelectric acoustic resonators 28, 30 are configured to have an identical polarity. For example, the first ferroelectric acoustic resonators 24, 26 and the second ferroelectric acoustic resonators 28, 30 are all c-type resonators or are all f-type resonators. In this regard, the first pulse voltage $V_{DC1}$ can be a positive pulse voltage $+V_{DC1}$ to cause the first equivalent capacitance $C0_1$ to decrease by $\Delta C_1$ and the second pulse voltage $V_{DC2}$ can be a negative pulse voltage $-V_{DC2}$ to cause the second equivalent capacitance $C0_2$ to increase by $\Delta C_2$.

Figure 3:
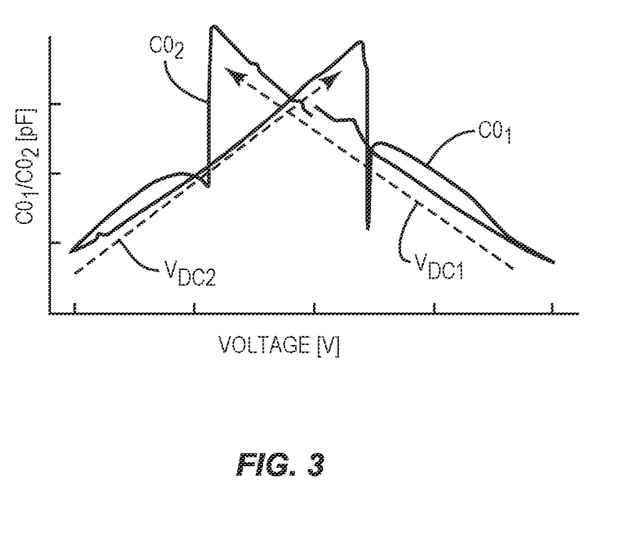
FIG. 3 is a graphic diagram providing an exemplary illustration as to how the tunable ferroelectric acoustic resonator structure of FIG. 2 can keep the equivalent capacitance unchanged while the series resonance frequency is tuned.

FIG. 3 is a graphic diagram providing an exemplary illustration as to how the tunable ferroelectric acoustic resonator structure 14 of FIG. 2 can keep the equivalent capacitance C0 unchanged while the series resonance frequency $f_S$ is tuned. As shown in FIG. 3, when the negative pulse voltage $-V_{DC2}$ increases, the second equivalent capacitance $C0_2$ increases accordingly. In contrast, when the positive pulse voltage $V_{DC1}$ increases, the first equivalent capacitance $C0_1$ decreases accordingly. As such, the positive pulse voltage $V_{DC1}$ and the negative pulse voltage $-V_{DC2}$ can be so determined to cause the second equivalent capacitance $C0_2$ to increase by an equal amount as the first equivalent capacitance $C0_1$ decreases, thus keeping the equivalent capacitance C0 unchanged.

With reference back to FIG. 2, in an embodiment, the tunable ferroelectric acoustic resonator structure 14 can further include a predetermined lookup table (LUT) 38, which may be programmed (e.g., by a transceiver circuit) via a radio-frequency front-end (RFFE) interface. The control circuit 36 may retrieve a pair of the first pulse voltage $V_{DC1}$ and the second pulse voltage $V_{DC2}$ from the predetermined LUT 38. Understandably, each pair of the first pulse voltage $V_{DC1}$ and the second pulse voltage $V_{DC2}$ are predetermined to cause the first variation $\Delta C_1$ and the second variation $\Delta C_2$ to be generated with the equal amount of each other but with different polarities ($\Delta C_1=-\Delta C_2$). The control circuit 36 may retrieve the first pulse voltage $V_{DC1}$ and the second pulse voltage $V_{DC2}$ from the predetermined LUT 38 based on a range of parameters, such as the series resonance frequency $f_S$ and/or the parallel resonance frequency $f_P$.

Upon determining the appropriate first pulse voltage $V_{DC1}$ and the second pulse voltage $V_{DC2}$ from the predetermined LUT 38, the control circuit 36 applies the first pulse voltage $V_{DC1}$ and the second pulse voltage $V_{DC2}$ to the first intermediate node 32 and the second intermediate node 34, respectively. In an embodiment, the control circuit 36 may be coupled to the first intermediate node 32 and the second intermediate node 34 via a first resistor $R_1$ and a second resistor $R_2$, respectively.

The tunable ferroelectric acoustic resonator structure 14 may also include a pair of switches 40, 42. Herein, the switch 40 is coupled to the signal input $S_{IN}$ and the switch 42 is coupled to the signal output $S_{OUT}$. The switches 40, 42 may be opened or closed by the control circuit 36 via a control signal 44.

In an embodiment, the control circuit 36 may close the switches 40, 42 concurrent to applying the first pulse voltage $V_{DC1}$ and the second pulse voltage $V_{DC2}$ to the first ferroelectric acoustic resonator network 20 and the second ferroelectric acoustic resonator network 22, respectively. In contrast, the control circuit 36 may open the switches 40, 42 concurrent to removing the first pulse voltage $V_{DC1}$ and the second pulse voltage $V_{DC2}$ from the first ferroelectric acoustic resonator network 20 and the second ferroelectric acoustic resonator network 22, respectively.

In an alternative embodiment, the first ferroelectric acoustic resonators 24, 26 can have an opposite polarity to the second ferroelectric acoustic resonators 28, 30. For example, the first ferroelectric acoustic resonators 24, 26 are c-type resonators and the second ferroelectric acoustic resonators 28, 30 are f-type resonators, or vice versa. In this regard, the first pulse voltage $V_{DC1}$ and the second pulse voltage $V_{DC2}$ can each be a positive pulse voltage. Accordingly, the first variation $\Delta C_1$ and the second variation $\Delta C_2$ will have an identical amount of each other but opposite polarities to cancel out each other.

Figure 4:
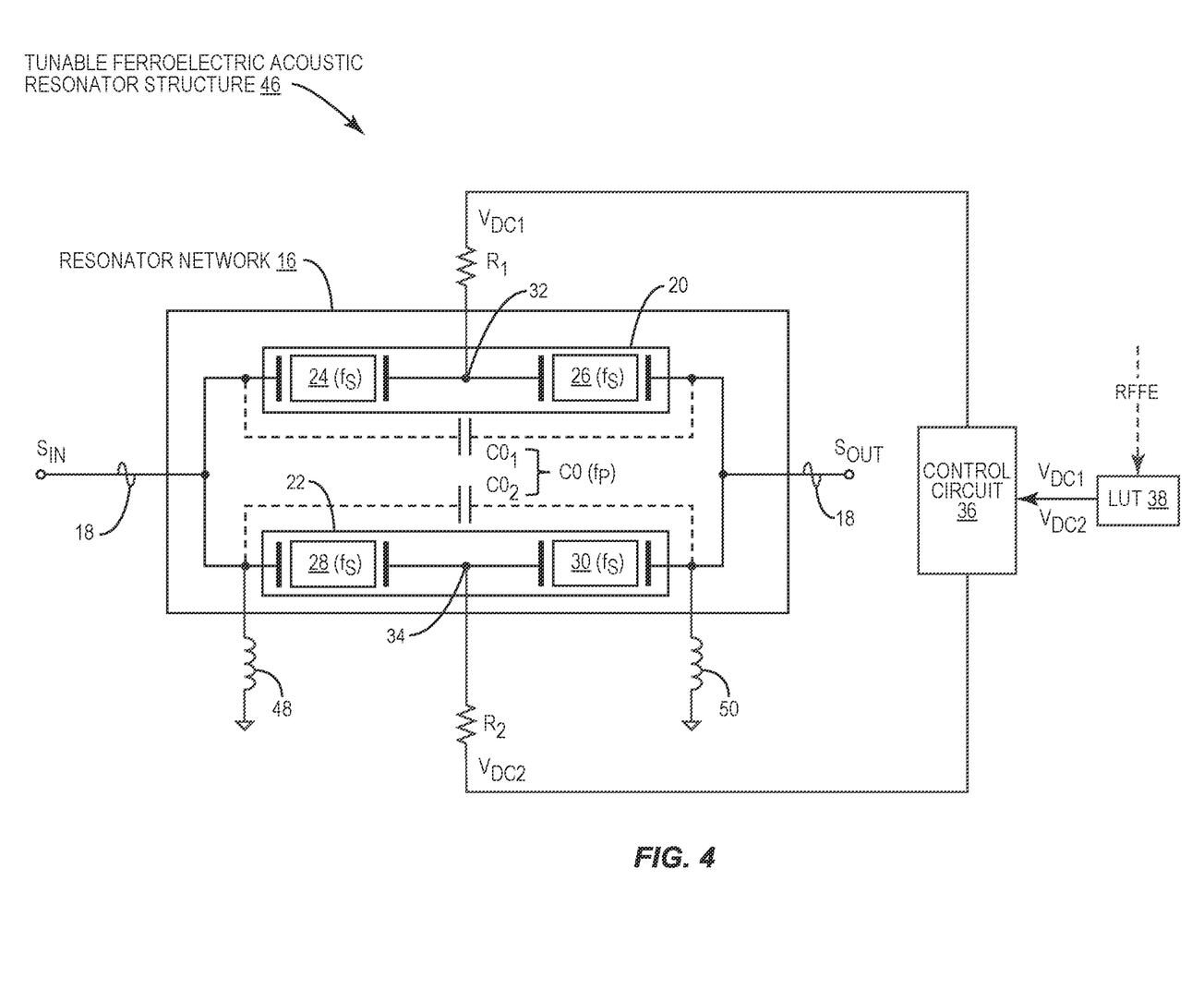
FIG. 4 is a schematic diagram of an exemplary tunable ferroelectric acoustic resonator structure configured according to another embodiment of the present disclosure.

The switches 40, 42 in the tunable ferroelectric acoustic resonator structure 14 may be replaced by a pair of inductors. In this regard, FIG. 4 is a schematic diagram of an exemplary tunable ferroelectric acoustic resonator structure 46 configured according to another embodiment of the present disclosure. Common elements between FIGS. 2 and 4 are shown therein with common element numbers and will not be re-described herein.

Herein, the tunable ferroelectric acoustic resonator structure 46 includes a pair of shunt inductors 48, 50. The shunt inductor 48 is coupled to the signal input $S_{IN}$ and the shunt inductor 50 is coupled to the signal output $S_{OUT}$. Each of the shunt inductors 48, 50 can act either as a high impedance or as a matching circuit at an RF frequency. The shunt inductors 48, 50 also allow a direct-current (DC) connection to ground for polarizing the resonator network 16 with the first pulse voltage $V_{DC1}$ and the second pulse voltage $V_{DC2}$.

Figure 5:
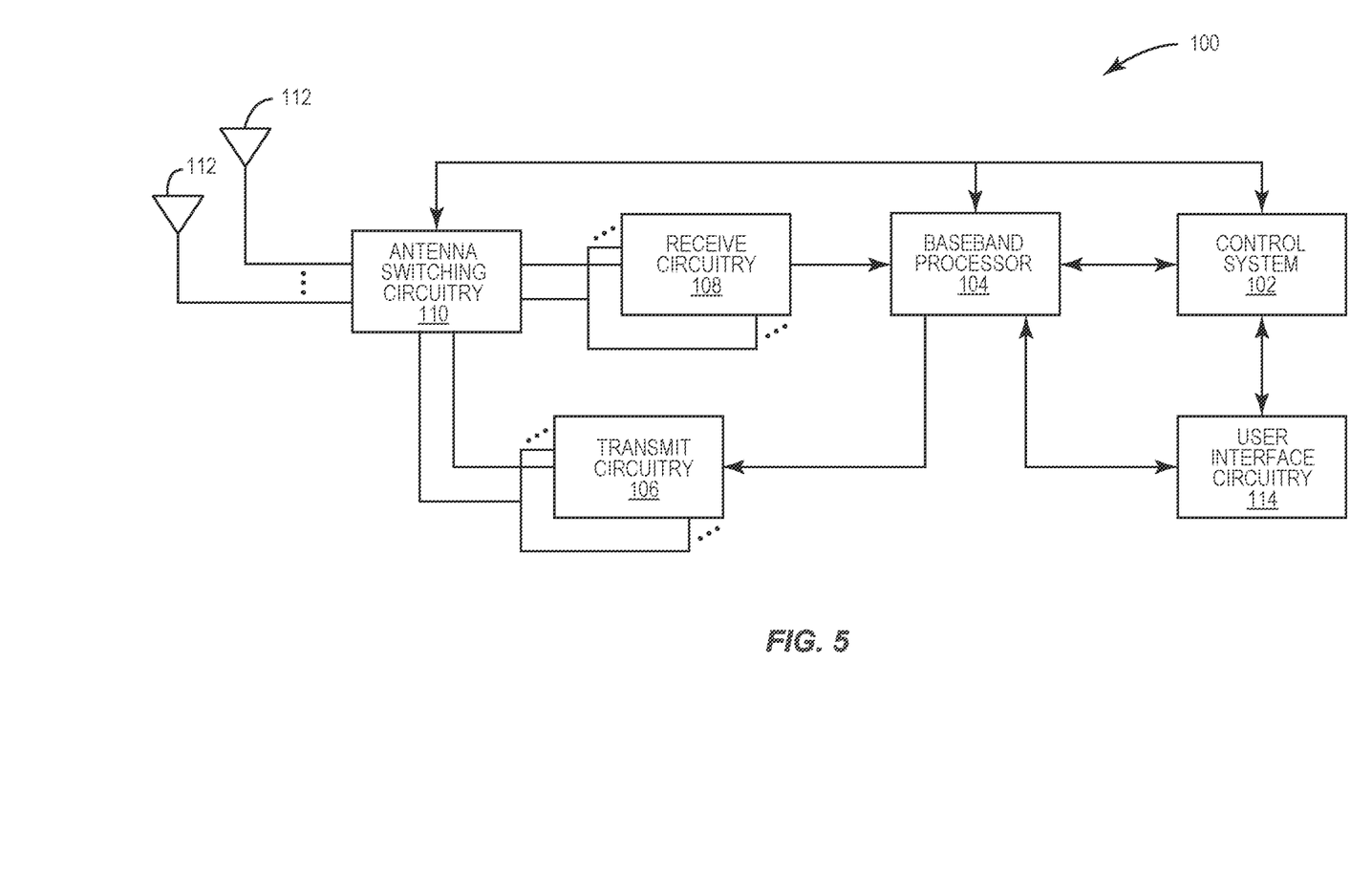
FIG. 5 is a schematic diagram of an exemplary user element wherein the tunable ferroelectric acoustic resonator structure of FIGS. 2 and 4 can be provided.

The tunable ferroelectric acoustic resonator structure 14 of FIG. 2 and the tunable ferroelectric acoustic resonator structure 46 of FIG. 4 can be provided in a user element to enable bandwidth adaptation according to embodiments described above. In this regard, FIG. 5 is a schematic diagram of an exemplary user element 100 wherein the tunable ferroelectric acoustic resonator structure 14 of FIG. 2 and the tunable ferroelectric acoustic resonator structure 46 of FIG. 4 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the embodiments of the present disclosure. All such improvements and modifications are considered within the scope of the concepts disclosed herein and the claims that follow.

What is claimed is:

1. A tunable ferroelectric acoustic resonator structure comprising:
   a resonator network configured to present an equivalent capacitance between a signal input and a signal output in a parallel resonance frequency, the resonator network comprising:
      a first ferroelectric acoustic resonator network configured to cause a first variation in the equivalent capacitance in response to receiving a first pulse voltage; and
      a second ferroelectric acoustic resonator network configured to cause a second variation in the equivalent capacitance in response to receiving a second pulse voltage; and a control circuit configured to:
    determine the first pulse voltage and the second pulse voltage such that the first variation cancels the second variation to thereby keep the equivalent capacitance unchanged; and
    apply the determined first pulse voltage and the determined second pulse voltage to the first ferroelectric acoustic resonator network and the second ferroelectric acoustic resonator network, respectively.

2. The tunable ferroelectric acoustic resonator structure of claim 1, wherein the control circuit is further configured to determine the first pulse voltage and the second pulse voltage to cause the first variation and the second variation to have an equal amount but different polarities.

3. The tunable ferroelectric acoustic resonator structure of claim 1, wherein:
    the first ferroelectric acoustic resonator network comprises a pair of first ferroelectric acoustic resonators coupled in series between the signal input and the signal output; and
    the second ferroelectric acoustic resonator network comprises a pair of second ferroelectric acoustic resonators coupled in series between the signal input and the signal output.

4. The tunable ferroelectric acoustic resonator structure of claim 3, wherein the control circuit is further configured to:
    apply the determined first pulse voltage to a first intermediate node located in between the pair of first ferroelectric acoustic resonators; and
    apply the determined second pulse voltage to a second intermediate node located in between the pair of second ferroelectric acoustic resonators.

5. The tunable ferroelectric acoustic resonator structure of claim 4, wherein the control circuit is coupled to the first intermediate node and the second intermediate node via a first resistor and a second resistor, respectively.

6. The tunable ferroelectric acoustic resonator structure of claim 1, wherein:
    the first ferroelectric acoustic resonator network and the second ferroelectric acoustic resonator network have an identical polarity; and
    the control circuit is further configured to:
        determine the first pulse voltage as a positive pulse voltage; and
        determine the second pulse voltage as a negative pulse voltage.

7. The tunable ferroelectric acoustic resonator structure of claim 1, wherein:
    the first ferroelectric acoustic resonator network and the second ferroelectric acoustic resonator network have opposite polarities; and
    the control circuit is further configured to determine each of the first pulse voltage and the second pulse voltage as a positive pulse voltage.

8. The tunable ferroelectric acoustic resonator structure of claim 1, wherein the control circuit is further configured to apply the determined first pulse voltage and the determined second pulse voltage to the first ferroelectric acoustic resonator network and the second ferroelectric acoustic resonator network, respectively, to thereby cause each of the first ferroelectric acoustic resonator network and the second ferroelectric acoustic resonator network to resonate at a series resonance frequency to pass a signal from the signal input to the signal output.

9. The tunable ferroelectric acoustic resonator structure of claim 8, further comprising a predetermined lookup table (LUT) correlating the first pulse voltage and the second pulse voltage with the series resonance frequency.

10. The tunable ferroelectric acoustic resonator structure of claim 9, wherein the control circuit is further configured to determine the first pulse voltage and the second pulse voltage from the predetermined LUT based on the series resonance frequency.

11. The tunable ferroelectric acoustic resonator structure of claim 1, further comprising a pair of switches each coupled to a respective one of the signal input and the signal output, wherein the control circuit is further configured to:
    close the pair of switches concurrent to applying the first pulse voltage and the second pulse voltage to the first ferroelectric acoustic resonator network and the second ferroelectric acoustic resonator network, respectively; and
    open the pair of switches concurrent to removing the first pulse voltage and the second pulse voltage from the first ferroelectric acoustic resonator network and the second ferroelectric acoustic resonator network, respectively.

12. The tunable ferroelectric acoustic resonator structure of claim 1, further comprising a pair of shunt inductors each coupled to a respective one of the signal input and the signal output, wherein the pair of shunt inductors are configured to provide a direct-current (DC) connection to a ground for polarizing the resonator network with the first pulse voltage and the second pulse voltage.

13. A resonator network configured to resonate at a series resonance frequency to pass a signal from a signal input to a signal output and present an equivalent capacitance between the signal input and the signal output in a parallel resonance frequency, the resonator network comprising:
    a first ferroelectric acoustic resonator network configured to:
        receive a first pulse voltage for tuning the first ferroelectric acoustic resonator network to the series resonance frequency; and
        cause a first variation in the equivalent capacitance in response to receiving the first pulse voltage; and
    a second ferroelectric acoustic resonator network configured to:
        receive a second pulse voltage for tuning the second ferroelectric acoustic resonator network to the series resonance frequency; and
        cause a second variation in the equivalent capacitance in response to receiving the second pulse voltage;
    wherein the first pulse voltage and the second pulse voltage are determined to cause the first variation to cancel the second variation to thereby keep the equivalent capacitance unchanged.

14. The resonator network of claim 13, wherein the first pulse voltage and the second pulse voltage are determined to cause the first variation and the second variation to have an equal amount but different polarities.

15. The resonator network of claim 13, wherein:
    the first ferroelectric acoustic resonator network comprises a pair of first ferroelectric acoustic resonators coupled in series between the signal input and the signal output; and
    the second ferroelectric acoustic resonator network comprises a pair of second ferroelectric acoustic resonators coupled in series between the signal input and the signal output.

16. The resonator network of claim 15, wherein:
    the first ferroelectric acoustic resonator network is further configured to receive the first pulse voltage at a first intermediate node located in between the pair of first ferroelectric acoustic resonators; and the second ferroelectric acoustic resonator network is further configured to receive the second pulse voltage at a second intermediate node located in between the pair of second ferroelectric acoustic resonators.

17. The resonator network of claim 13, wherein:

the first ferroelectric acoustic resonator network and the second ferroelectric acoustic resonator network have an identical polarity;

the first pulse voltage is a positive pulse voltage; and the second pulse voltage is a negative pulse voltage.

18. The resonator network of claim 13, wherein:

the first ferroelectric acoustic resonator network and the second ferroelectric acoustic resonator network have opposite polarities; and each of the first pulse voltage and the second pulse voltage is a positive pulse voltage.

19. A wireless device comprising a tunable ferroelectric acoustic resonator structure, the tunable ferroelectric acoustic resonator structure comprises:

a resonator network configured to present an equivalent capacitance between a signal input and a signal output in a parallel resonance frequency, the resonator network comprising:

a first ferroelectric acoustic resonator network configured to cause a first variation in the equivalent capacitance in response to receiving a first pulse voltage; and a second ferroelectric acoustic resonator network configured to cause a second variation in the equivalent capacitance in response to receiving a second pulse voltage; and a control circuit configured to:

determine the first pulse voltage and the second pulse voltage such that the first variation cancels the second variation to thereby keep the equivalent capacitance unchanged; and apply the determined first pulse voltage and the determined second pulse voltage to the first ferroelectric acoustic resonator network and the second ferroelectric acoustic resonator network, respectively.

* * * * *